US011422461B2

(12) United States Patent
Nakamura et al.

(10) Patent No.: US 11,422,461 B2
(45) Date of Patent: Aug. 23, 2022

(54) IMPRINT APPARATUS AND METHOD OF MANUFACTURING ARTICLE

(71) Applicant: CANON KABUSHIKI KAISHA, Tokyo (JP)

(72) Inventors: Tadao Nakamura, Utsunomiya (JP); Takamitsu Komaki, Utsunomiya (JP); Kiyohito Yamamoto, Utsunomiya (JP)

(73) Assignee: CANON KABUSHIKI KAISHA, Tokyo (JP)

(*) Notice: Subject to any disclaimer, the term of this patent is extended or adjusted under 35 U.S.C. 154(b) by 235 days.

(21) Appl. No.: 16/847,035

(22) Filed: Apr. 13, 2020

(65) Prior Publication Data

US 2020/0331190 A1 Oct. 22, 2020

(30) Foreign Application Priority Data

Apr. 16, 2019 (JP) .............................. JP2019-077872

(51) Int. Cl.
*B29C 59/02* (2006.01)
*B29C 33/42* (2006.01)
*G03F 7/00* (2006.01)
*B29C 37/00* (2006.01)

(52) U.S. Cl.
CPC .......... *G03F 7/0002* (2013.01); *B29C 33/424* (2013.01); *B29C 59/02* (2013.01); *B29C 2037/90* (2013.01)

(58) Field of Classification Search
CPC . B29C 59/02; B29C 33/424; B29C 2033/426; B29C 37/005; B29C 2037/90; G03F 7/0002; G03F 9/7042
See application file for complete search history.

(56) References Cited

U.S. PATENT DOCUMENTS

| 10,578,984 B2 | 3/2020 | Meissl | |
| 2005/0270516 A1* | 12/2005 | Cherala | B82Y 10/00 355/72 |
| 2016/0001492 A1* | 1/2016 | Yamaguchi | G03F 7/0002 425/225 |

(Continued)

FOREIGN PATENT DOCUMENTS

| JP | 2014110368 A | * | 6/2014 |
| JP | 2014110368 A | | 6/2014 |
| JP | 2014110384 A | * | 6/2014 |

(Continued)

*Primary Examiner* — Jerzi H Moreno Hernandez
(74) *Attorney, Agent, or Firm* — Rossi, Kimms & McDowell LLP

(57) ABSTRACT

An imprint apparatus for performing an imprint process of forming a pattern of an imprint material on a substrate using a mold is disclosed. The imprint apparatus includes an adjustment unit configured to adjust a shape of the mold and a control unit configured to control the imprint process. The control unit obtains information indicating a tendency concerning a change of the shape of the mold corresponding to a use count of the mold used for the imprint process and controls the adjustment unit to correct the shape of the mold in accordance with the obtained information and a present use count of the mold. The control unit also controls the imprint apparatus to perform the imprint process after the shape of the mold has been corrected by the adjustment unit.

10 Claims, 8 Drawing Sheets

(56) References Cited

U.S. PATENT DOCUMENTS

2016/0271845 A1* 9/2016 Yamazaki ............. G03F 7/0002

FOREIGN PATENT DOCUMENTS

| JP | 2014110384 A | 6/2014 |
| JP | 6273860 B2 | 2/2018 |
| JP | 2018101779 A | 6/2018 |
| JP | 2019054211 A | 4/2019 |

* cited by examiner

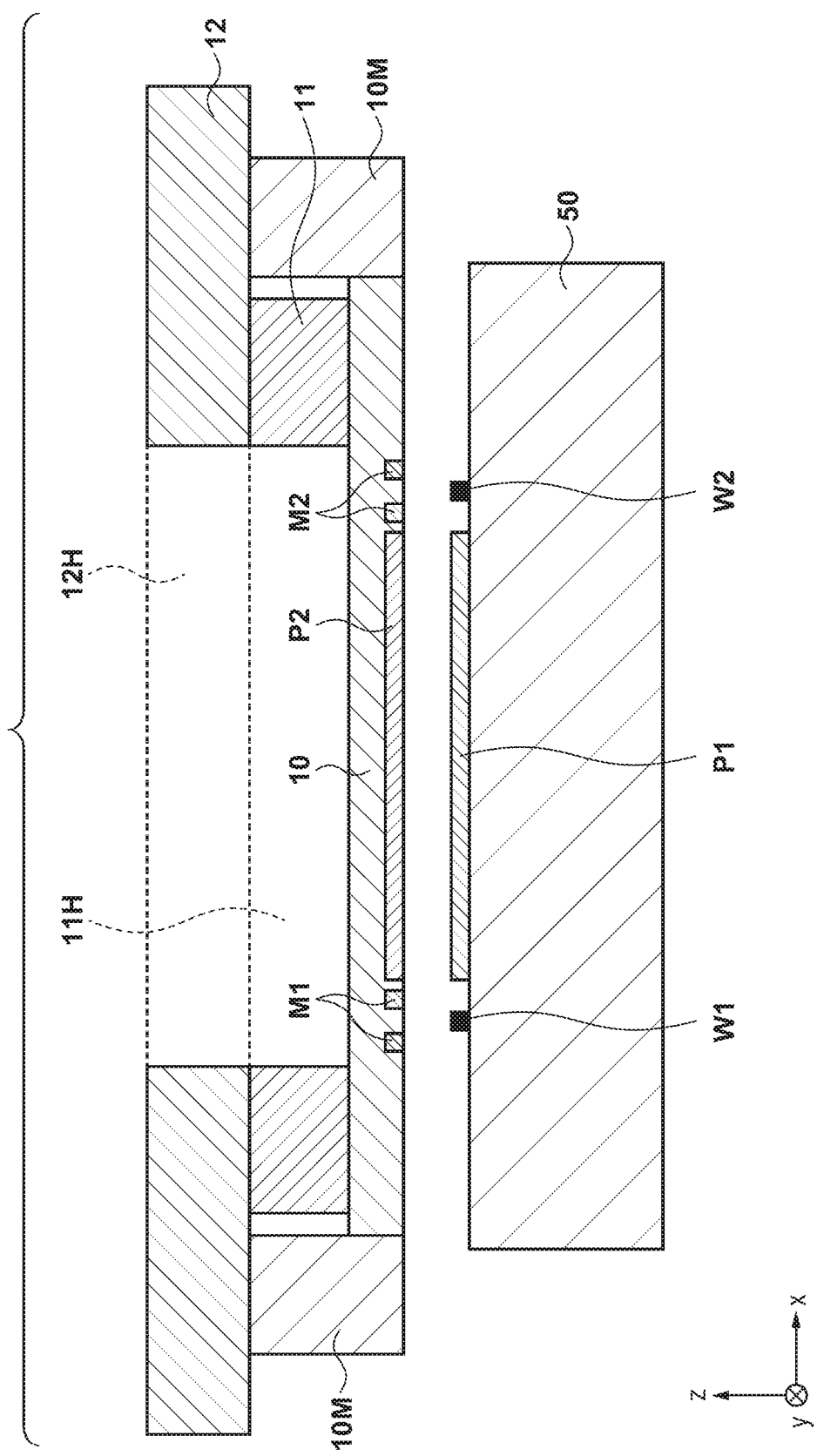

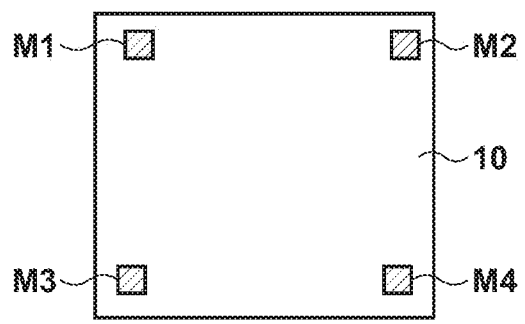
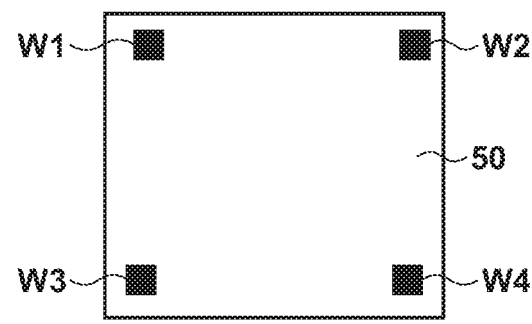
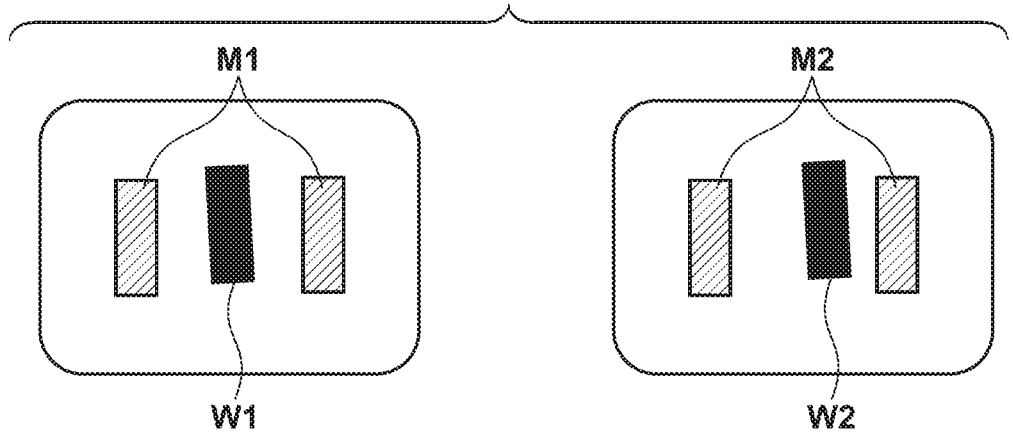
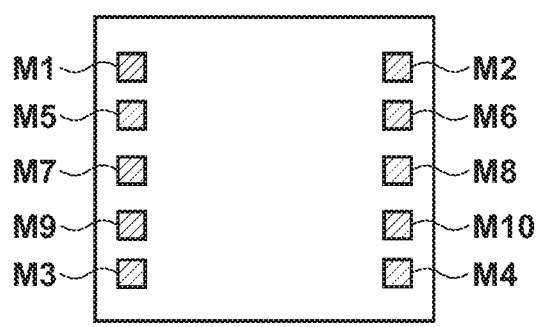
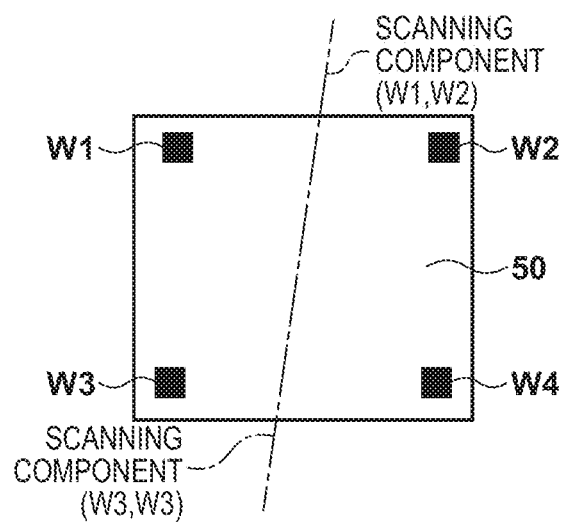

FIG. 10A

THRESHOLD OF DEFORMATION AMOUNT = 0.2

| MOLD NAME | MOLD A | MOLD B | MOLD C | MOLD D | MOLD E | MOLD F |
|---|---|---|---|---|---|---|
| DIFFERENCE FROM PAST TENDENCY | 0.1 | 0.15 | -0.1 | 0.02 | 0 | 0.5 |

FIG. 10B

THRESHOLD OF DEFORMATION AMOUNT = 0.2

| MOLD NAME | MOLD G | MOLD H | MOLD I | MOLD J | MOLD K | MOLD L |
|---|---|---|---|---|---|---|
| DIFFERENCE FROM PAST TENDENCY | 0.2 | 0.15 | 0.1 | 0.2 | 0.2 | 0.13 |

F I G. 11A
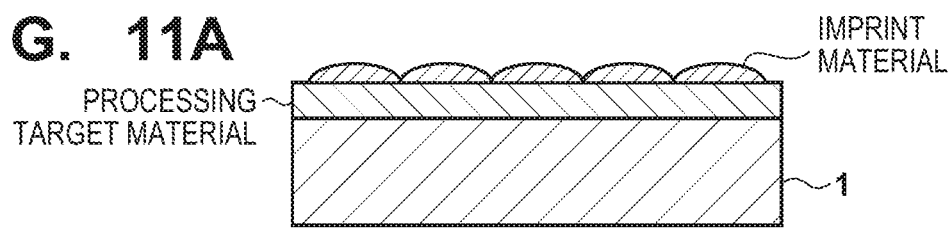
F I G. 11B
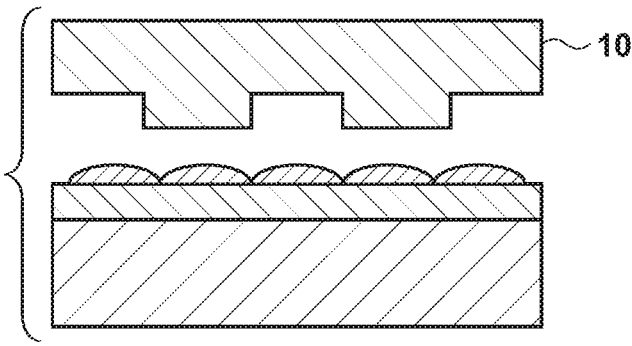
F I G. 11C
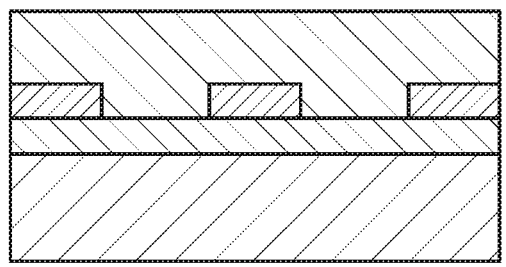
F I G. 11D
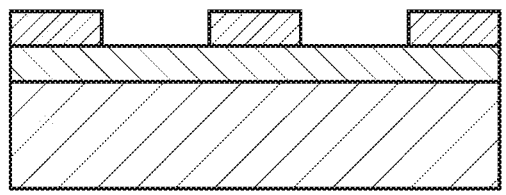
F I G. 11E
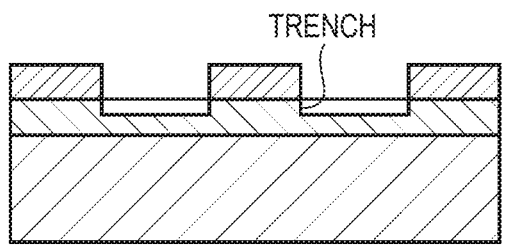
F I G. 11F
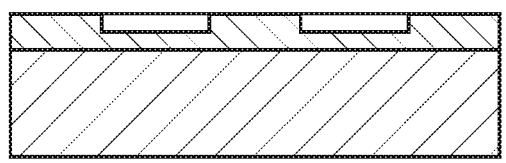

IMPRINT APPARATUS AND METHOD OF MANUFACTURING ARTICLE

BACKGROUND OF THE INVENTION

Field of the Invention

The present invention relates to an imprint apparatus and a method of manufacturing an article.

Description of the Related Art

An imprint technique is a technique capable of transferring a nanoscale micropattern, and has received attention as one type of nanolithography technique for mass-producing semiconductor devices and magnetic storage media. An imprint apparatus using the imprint technique cures an imprint material in a state in which a pattern-formed mold is in contact with the imprint material on a substrate, and separates the mold from the cured imprint material, thereby forming a pattern on the substrate.

A mold used in an imprint apparatus is generally called a replica mold, and is created by the imprint technique using, as an original, a master mold on which a micropattern is formed. The imprint apparatus is also used when creating a replica mold from a master mold.

To make, into a desired shape, the shape of the pattern of an imprint material formed on a substrate using an imprint apparatus, the pattern (shape) of a master mold needs to be accurately transferred to a replica mold. In addition, to create a replica mold, the relative position between a master mold (the pattern thereof) and a substrate (a preset region thereof to which the pattern of the master mold is to be transferred) called a blank mold needs to be aligned accurately.

Japanese Patent Laid-Open No. 2014-110384 discloses a technique of measuring a relative position shift amount between a mold and a substrate, and adjusting the size of the pattern of the mold so as to minimize the relative position shift amount. Furthermore, Japanese Patent Laid-Open No. 2014-110368 discloses a technique of correcting the shape of a master mold using a reference substrate to cope with a case in which a mark for measuring a relative position with respect to a master mold is not formed on a replica mold (blank mold).

However, the technique disclosed in Japanese Patent Laid-Open No. 2014-110384 assumes that a mark for measuring a relative position with respect to the mold is formed on the substrate. Therefore, if the mark is not formed on the substrate such as a substrate (blank mold) for creating a replica mold or a substrate on which the first layer is formed, the relative position between the mold and the substrate cannot be measured. Newly forming a mark on such substrate can also be considered. However, since it is necessary to perform a step of forming a mark, a problem generally arises that the cost increases.

The technique disclosed in Japanese Patent Laid-Open No. 2014-110368 can measure the relative position with respect to the master mold even if the mark is not formed on the substrate. However, a chucking error caused by conveyance of the reference substrate is concerned, thereby influencing correction of the shape of the master mold. Furthermore, since it is necessary to convey the reference substrate when measuring the relative position with respect to the master mold, the productivity of the imprint apparatus decreases.

SUMMARY OF THE INVENTION

The present invention provides an imprint apparatus advantageous in correcting the shape of a mold while maintaining the productivity.

According to one aspect of the present invention, there is provided an imprint apparatus for performing an imprint process of forming a pattern of an imprint material on a substrate using a mold, including an adjustment unit configured to adjust a shape of the mold, and a control unit configured to control the imprint process, wherein the control unit obtains information indicating a tendency concerning a change of the shape of the mold corresponding to a use count of the mold used for the imprint process, and performs the imprint process while correcting the shape of the mold by the adjustment unit in accordance with the use count of the mold based on the information.

Further features of the present invention will become apparent from the following description of exemplary embodiments (with reference to the attached drawings).

BRIEF DESCRIPTION OF THE DRAWINGS

FIG. 2 is a schematic sectional view showing the periphery of a mold chuck and a reference plate.

FIGS. 3A and 3B are views each showing an example of the arrangement of reference marks provided on a mold or the reference plate.

FIG. 4 is a view showing the reference marks on the mold and those on the reference plate detected by an alignment scope.

FIGS. 5A and 5B are views each showing an example of the arrangement of the reference marks provided on the mold or the reference plate.

FIGS. 10A and 10B are tables each showing, for a plurality of molds, results of comparison with the past tendency of a deformation amount.

FIGS. 11A to 11F are views for explaining a method of manufacturing an article.

DESCRIPTION OF THE EMBODIMENTS

Figure 1:
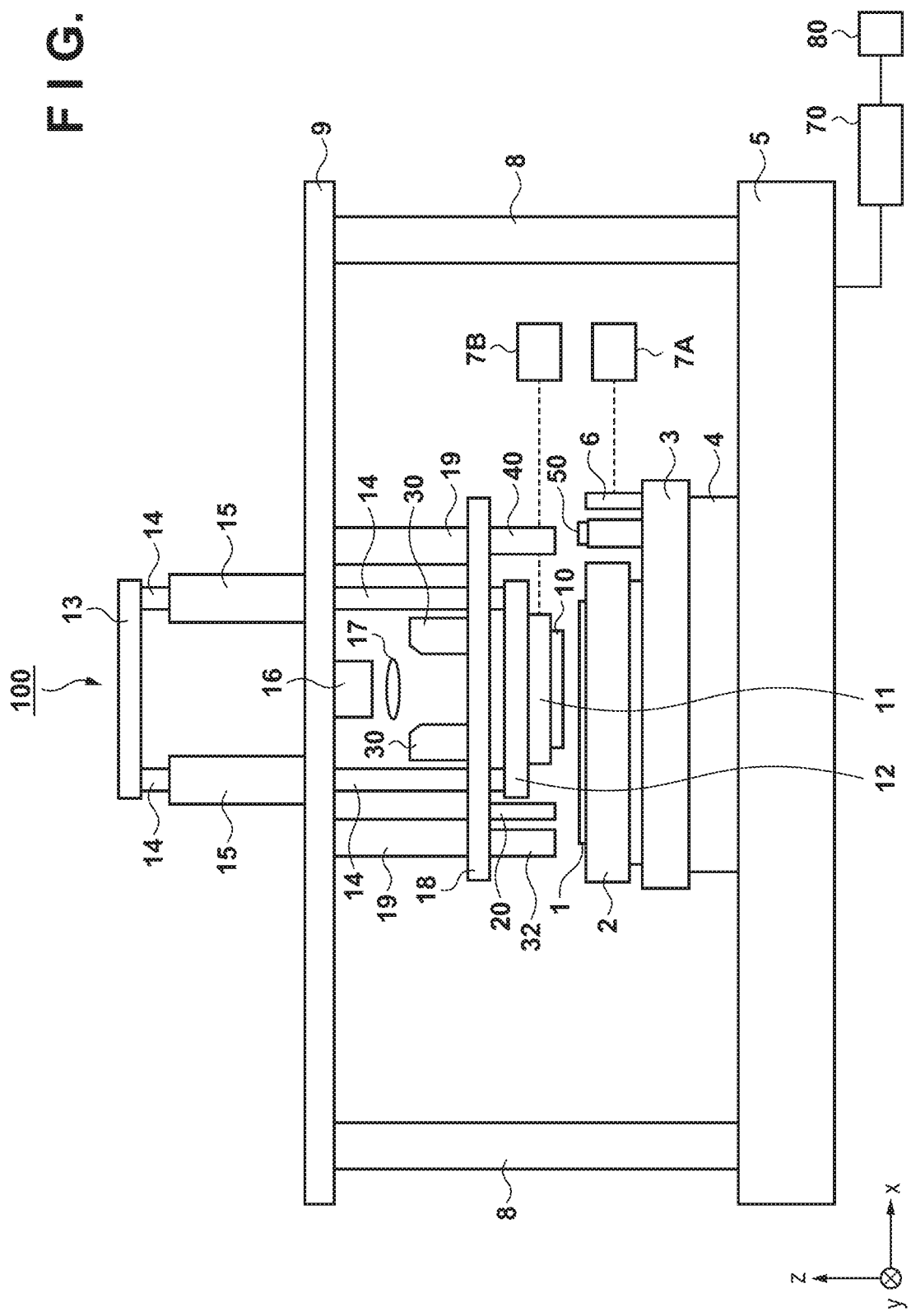
FIG. 1 is a schematic view showing the arrangement of an imprint apparatus according to one aspect of the present invention.

Hereinafter, embodiments will be described in detail with reference to the attached drawings. Note, the following embodiments are not intended to limit the scope of the claimed invention. Multiple features are described in the embodiments, but limitation is not made an invention that requires all such features, and multiple such features may be combined as appropriate. Furthermore, in the attached drawings, the same reference numerals are given to the same or similar configurations, and redundant description thereof is omitted.

FIG. 1 is a schematic view showing the arrangement of an imprint apparatus 100 according to one aspect of the present invention. The imprint apparatus 100 is a lithography apparatus that performs an imprint process of forming a pattern of an imprint material on a substrate using a mold. The imprint apparatus 100 brings a mold into contact with an imprint material supplied onto a substrate and applies curing energy to the imprint material, thereby forming a pattern of a cured product to which an uneven pattern of the mold is transferred.

As the imprint material, a curable composition (to be also referred to as a resin in an uncured state) to be cured by receiving curing energy is used. Examples of the curing energy are an electromagnetic wave and the like. As the electromagnetic wave, for example, light selected from the wavelength range of 10 nm (inclusive) to 1 mm (inclusive) is used. Examples of the electromagnetic wave are infrared light, a visible light beam, and ultraviolet light.

The curable composition is a composition cured with light irradiation. The photo-curable composition cured by light irradiation contains at least a polymerizable compound and a photopolymerization initiator, and may contain a nonpolymerizable compound or a solvent, as needed. The nonpolymerizable compound is at least one material selected from the group consisting of a sensitizer, a hydrogen donor, an internal mold release agent, a surfactant, an antioxidant, and a polymer component.

The imprint material may be applied in a film shape onto the substrate by a spin coater (spin coating method) or a slit coater (slit coating method). The imprint material may be applied, onto the substrate, in a droplet shape or in an island or film shape formed by connecting a plurality of droplets using a liquid injection head. The viscosity (the viscosity at 25° C.) of the imprint material is, for example, 1 mPa·s (inclusive) to 100 mPa·s (inclusive).

As the substrate, glass, ceramic, a metal, a semiconductor, a resin, or the like is used. A member made of a material different from that of the substrate may be formed on the surface of the substrate, as needed. More specifically, examples of the substrate are a silicon wafer, a semiconductor compound wafer, and silica glass.

In this embodiment, the imprint apparatus 100 adopts a photo-curing method as a method of curing the imprint material. Note that as shown in FIG. 1, directions are shown using the xyz coordinate system in which the directions parallel to the surface of a substrate 1 are assumed to be on the x-y plane. The directions parallel to the x-axis, the y-axis, and the z-axis in the xyz coordinate system are assumed to be the x direction, the y direction, and the z direction, respectively.

A mold 10 may be called an original, a mold, or a template. A pattern to be transferred to the substrate 1 is formed on the mold 10 by electron beam exposure (drawing) or the like.

A chuck 2 holds the substrate 1, and is supported by a fine movement stage 3. The fine movement stage 3 has an adjustment function in the θ direction (the rotation direction around the z-axis) of the substrate 1, an adjustment function of the position of the substrate 1 in the z-axis direction, and an adjustment function of an inclination (tilt) of the substrate 1 with respect to the x-y plane. The fine movement stage 3 is supported by a coarse (xy) movement stage 4. The coarse movement stage 4 has a function of positioning the substrate 1 at a predetermined position on the x-y plane. A combination of the fine movement stage 3 and the coarse movement stage 4 will be referred to as a substrate stage hereinafter.

The substrate stage is arranged on a base 5. A mirror 6 is provided on the substrate stage. When a laser interferometer 7A detects light reflected by the mirror 6, the position of the substrate stage in the x direction and the y direction can be obtained. However, an arrangement of measuring the position of the substrate stage is not limited to this, and a technique well known in this art is applicable.

A mold chuck 11 holds the mold 10 via a mechanical holding mechanism (not shown). A mold stage 12 holds the mold chuck 11 via a mechanical holding mechanism (not shown). The mold stage 12 has an adjustment function of rotating the mold 10 (mold chuck 11) in the θ direction, and an adjustment function of inclining (tilting) the mold 10 with respect to the x-y plane.

The mold chuck 11 has a reflecting surface on its side surface. When a laser interferometer 7B detects light reflected by the reflecting surface, the position of the mold chuck 11 in the x direction and the y direction can be obtained. Instead of measuring the position of the mold chuck 11, the position of the mold stage 12 may be obtained by providing a reflecting surface in the mold stage 12 and detecting, by a laser interferometer, light reflected by the reflecting surface. However, an arrangement of measuring the position of the mold chuck 11 or the mold stage 12 is not limited to this, and a technique well known in the art is applicable.

Columns 8 are arranged on the base 5 to support a top plate 9. Through holes are formed in the top plate 9. Each guide bar 14 extends through the through hole of the top plate 9, and the end of the guide bar 14 is fixed to a guide bar plate 13 and the other end is fixed to the mold stage 12.

Each mold elevating unit 15 includes, for example, a linear actuator, and drives the guide bar 14 in the z direction. The mold elevating units 15 bring the mold 10 held by the mold chuck 11 into contact with the imprint material on the substrate, and separate the mold 10 from the imprint material on the substrate. The mold chuck 11 or the mold stage 12 is provided with a plurality of load cells (load sensors). Each load cell measures the pressing force of the mold 10 against the imprint material on the substrate.

An alignment base 18 is hung from the top plate 9 via columns 19. The guide bars 14 extend through the alignment base 18, and an opening that passes light from a light source 16 (curing unit) is formed in the alignment base 18. In addition, the alignment base 18 is provided with a gap sensor 20 for measuring the height and flatness of the substrate 1. As the gap sensor 20, for example, a capacitance sensor or the like is used.

Alignment scopes 30 are provided on the alignment base 18, and detect, via the mold 10, a reference mark provided on each of the mold 10 and the substrate stage. Each alignment scope 30 is formed by a TTM (Through The Mold) alignment scope including an imaging system and an optical system for detecting the reference mark provided on each of the mold 10 and the substrate stage. The alignment scopes 30 function as a measurement unit that measures a relative shape difference or a relative positional shift in the x direction and the y direction between the mold 10 and the substrate 1 by detecting the reference marks. Note that in this embodiment, the reference mark provided on the substrate stage is formed on a reference plate 50 arranged on the substrate stage.

In this embodiment, two alignment scopes 30 are provided along each of the x direction and the y direction to detect the reference marks formed along the x direction and the y direction. When, for example, the alignment scopes 30 detect two reference marks along the x direction, it is possible to measure a magnification component in the x direction of the shape difference between the pattern region of the mold 10 and the shot region (imprint region) of the substrate 1. Similarly, when the alignment scopes 30 detect two reference marks along the y direction, it is possible to measure a magnification component in the y direction of the shape difference between the pattern region of the mold 10 and the imprint region of the substrate 1.

A supply unit 32 includes a dispenser head that supplies the imprint material onto the substrate. The dispenser head includes a nozzle that discharges droplets of the imprint material to the substrate 1. In this embodiment, the supply unit 32 uses, as the imprint material, a photo-curable imprint material that is cured by light irradiation.

In a state in which the imprint material on the substrate is in contact with the mold 10, the light source 16 irradiates the imprint material with light via a collimator lens 17. Conditions of the wavelength of light emitted from the light source 16 to the imprint material on the substrate via the collimator lens 17 and the like are appropriately determined in accordance with the imprint material. To transmit light from the light source 16, the mold 10 is made of a material such as quartz that transmits light.

An off-axis alignment scope 40 detects an alignment mark provided on the substrate 1 and a reference mark formed on the reference plate 50. Unlike the alignment scope 30, the off-axis alignment scope 40 can detect the alignment mark on the substrate and the reference mark on the reference plate without intervention of the mold 10.

A control unit 70 is formed by a computer including a CPU and a memory, and operates the imprint apparatus 100 by comprehensively controlling the units of the imprint apparatus 100 in accordance with a program stored in a storage unit 80. The control unit 70 controls an imprint process of transferring the pattern of the mold 10 to the imprint material supplied onto the substrate.

FIG. 2 is a schematic sectional view showing the periphery of the mold chuck 11 and the reference plate 50. With reference to FIG. 2, an opening 11H that passes light from the light source 16 is formed in the mold chuck 11. Similarly, an opening 12H that passes light from the light source 16 is formed in the mold stage 12. Note that in this embodiment, the mold chuck 11 and the mold stage 12 are formed separately but may be formed integrally.

A shape adjustment unit 10M that adjusts the shape of the mold 10 is provided in the mold stage 12 to surround the mold 10 held by the mold chuck 11. The shape adjustment unit 10M compresses and deforms the mold 10 by applying a force to the side surfaces of the mold 10, that is, by pressurizing the side surfaces of the mold 10. The shape adjustment unit 10M is formed by, for example, a piezoelectric element. When the shape adjustment unit 10M compresses the mold 10, the magnification and shape of the mold 10 (the pattern thereof) can be changed. The shape adjustment unit 10M can individually change the magnification and shape of the mold 10 in each of the x direction and the y direction.

When obtaining the adjustment amount of the shape of the mold 10 by the shape adjustment unit 10M, the substrate stage is moved to a position at which the alignment scopes 30 can observe the mold 10 and the reference plate 50, that is, a position at which the alignment scopes 30 can detect the reference marks on the mold 10 and the reference plate 50. Next, the four alignment scopes 30 detect the reference marks on the mold 10 and those on the reference plate 50 to measure the relative positional shift, thereby obtaining the shape of the mold 10 with reference to the reference marks. The shape of the mold 10 includes, for example, an X-magnification component, a Y-magnification component, an X-tilt component, and a Y-tilt component. The adjustment amount of the shape of the mold 10 by the shape adjustment unit 10M which is necessary to change the shape of the mold 10 to a predetermined shape, is obtained from the thus obtained shape of the mold 10. Furthermore, by increasing the number of reference marks to be detected, it is possible to correct a higher-order shape in addition to the magnification components and tilt components.

FIG. 3A is a view showing an example of the arrangement of reference marks M1, M2, M3, and M4 provided on the mold 10. FIG. 3B is a view showing an example of the arrangement of reference marks W1, W2, W3, and W4 provided on the reference plate 50. In this embodiment, the reference marks M1 to M4 are arranged in the pattern region (mesa) of the mold 10, and the reference marks W1 to W4 are arranged on the reference plate 50 in correspondence with the reference marks M1 to M4, respectively. In this way, in this embodiment, the reference marks M1 to M4 and W1 to W4 are formed so as to measure magnification components in the x and y directions.

The alignment scopes 30 simultaneously detect the reference marks M1 to M4 shown in FIG. 3A and the reference marks W1 to W4 shown in FIG. 3B to measure respective positional shift amounts. In this embodiment, the alignment scopes 30 can measure the positional shift amounts (x, y, and z directions) of the reference marks M1 to M4 of the mold 10 with reference to the reference marks W1 to W4 of the reference plate 50, respectively.

FIG. 4 is a view showing the reference marks M1 and M2 on the mold 10 and the reference marks W1 and W2 on the reference plate 50 detected by the alignment scopes 30. In a state of a narrow gap (for example, 5 μm to 30 μm) such that the pattern of the mold 10 and the reference plate 50 are not in contact with each other (they are not broken), the reference marks M1 and M2 and the reference marks W1 and W2 are detected. By simultaneously detecting the reference marks M1 and M2 and the reference marks W1 and W2, it is possible to obtain the rotation amount in the θ direction and the shift amount in the x and y directions of the mold 10 with respect to the reference plate 50.

In fact, the four alignment scopes 30 are used to detect the reference marks M1 to M4 on the mold 10 and the reference marks W1 to W4 on the reference plate 50. Then, the relative positional shift amount between each of the reference marks M1 to M4 on the mold 10 and each of the reference marks W1 to W4 on the reference plate 50 is obtained, and the positional shift amounts are converted into the shape of the mold 10 with reference to the reference marks W1 to W4.

In this embodiment, marks that allow measurement of positional shift amounts in the x and y directions are used as the reference marks M1 to M4 and W1 to W4. However, the present invention is not limited to this. For example, marks that allow measurement of a positional shift amount in one of the x, y, and z directions may be used as the reference marks M1 to M4 and W1 to W4 to measure a positional shift amount in each direction.

As shown in FIGS. 5A and 5B, the number of reference marks M1 to M10 on the mold 10 may be different from the number of reference marks W1 to W4 on the reference plate 50. FIG. 5A is a view showing an example of the arrangement of the reference marks M1 to M10 provided on the mold 10. FIG. 5B is a view showing an example of the arrangement of the reference marks W1 to W4 provided on the reference plate 50. With reference to FIGS. 5A and 5B, the reference marks M1 to M10 are arranged in the pattern region of the mold 10, and the reference marks W1 to W4 are arranged on the reference plate 50. In this case, for example, the reference marks W1 and W2 on the reference plate 50 are fixed as reference marks to be used for measurement and measurement is performed while moving the substrate stage on which the reference plate 50 is provided. However, a scanning component of the substrate stage becomes a measurement error. Therefore, it is necessary to obtain in advance an error (for example, a scanning component (W1, W2)) for each of pairs of the reference marks W1 and W2 on the reference plate 50 and the reference marks on the mold 10, and removing the error from a measured value. Note that a manufacturing error of the reference mark and a factor that changes with time are corrected by periodically performing calibration.

In this embodiment, with respect to correction of the shape of the mold 10 in the imprint process, the x-magnification component and the y-magnification component are corrected by the shape adjustment unit 10M. The x-tilt component and y-tilt component are corrected by inclining the mold 10 (mold stage 12) in the tilt direction. Note that the x-tilt component and the y-tilt component may be corrected by inclining the substrate stage holding the substrate 1 in the tilt direction.

Figure 6:
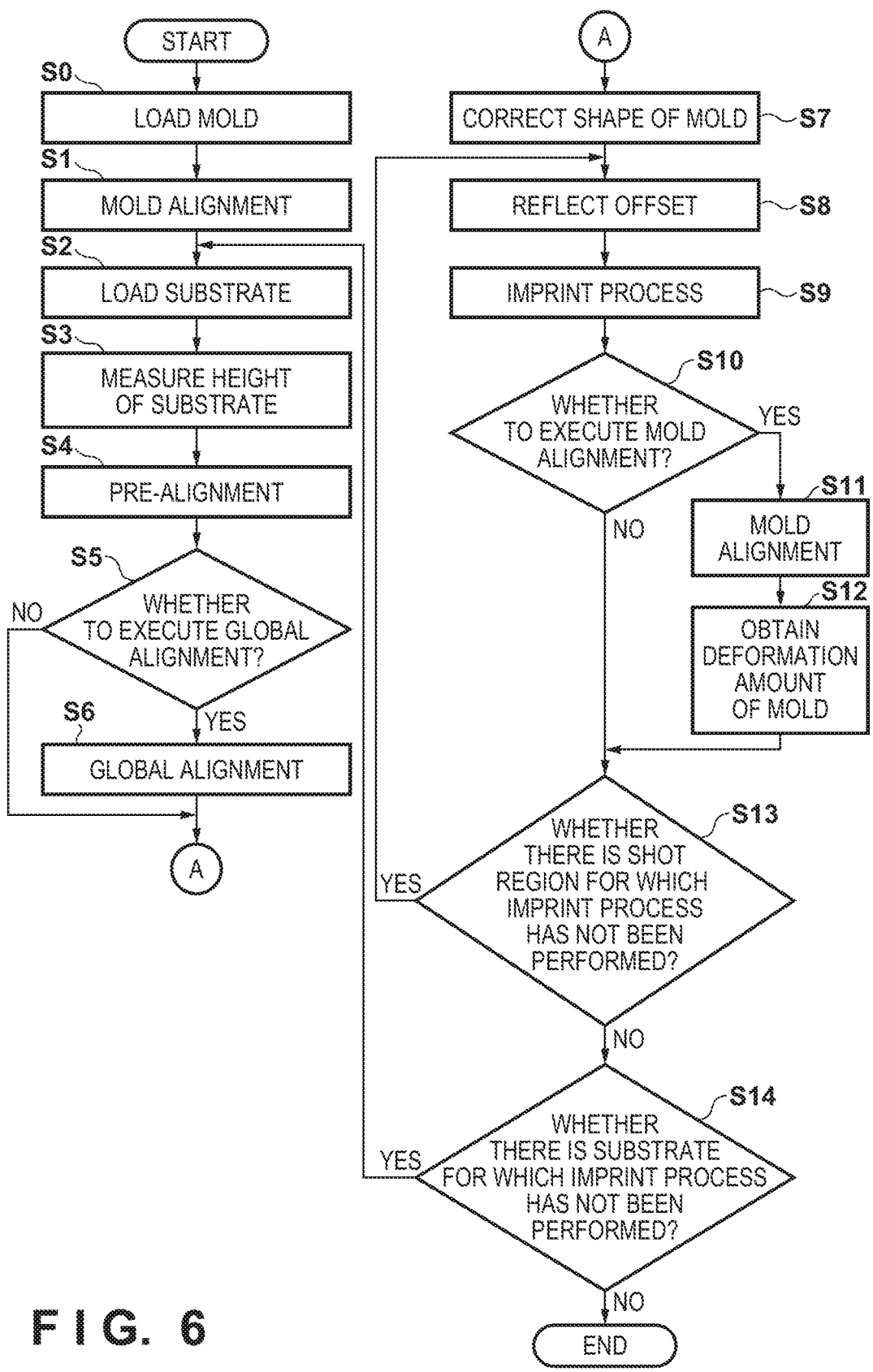
FIG. 6 is a flowchart for explaining the operation of the imprint apparatus shown in FIG. 1.

The operation of the imprint apparatus 100 will be described with reference to FIG. 6. As described above, the imprint apparatus 100 operates when the control unit 70 comprehensively controls the units of the imprint apparatus 100. This operation is an operation of transferring the pattern of the mold 10 to the imprint material on the substrate.

In step S0, a mold conveyance mechanism (not shown) loads the mold 10 into the imprint apparatus 100 to cause the mold chuck 11 to hold the mold 10.

In step S1, mold alignment is executed. More specifically, the substrate stage is moved to a position at which the alignment scopes 30 can detect the reference marks on the mold 10 and the reference plate 50, and the alignment scopes 30 simultaneously detect the reference marks on the mold 10 and those on the reference plate 50. As described above, the shape of the mold 10 is obtained with reference to the reference marks W1 to W4 of the reference plate 50, and is stored in the storage unit 80.

Note that in step S1, the shape adjustment unit 10M may correct the shape of the mold 10 based on the thus obtained shape of the mold 10. Furthermore, in a subsequent step, the shape adjustment unit 10M may correct the shape of the mold 10 in consideration of global alignment and an offset amount.

In step S2, a substrate conveyance mechanism (not shown) loads the substrate 1 into the imprint apparatus 100 to cause the chuck 2 to hold the substrate 1.

In step S3, the height of the substrate 1 is measured. More specifically, the gap sensor 20 provided on the alignment base 18 measures the height (flatness) of the entire surface of the substrate 1 while moving the substrate stage (substrate 1). The thus obtained height of the substrate 1 is used to align, with a reference plane (not shown), the surface of the substrate 1 onto which the pattern of the mold 10 is to be transferred, when bringing the mold 10 into contact with the imprint material on the substrate.

In step S4, pre-alignment is executed. More specifically, a pre-alignment measurement unit including a scope with a wide field of view (detection range) at a low magnification detects a pre-alignment mark (for example, a notch) formed on the substrate 1. Shift amounts in the x and y directions and the rotation shift amount in the θ direction of the substrate 1 with respect to the imprint apparatus 100 are obtained by processing the detection result (mark signal or mark image) of the pre-alignment mark. The substrate stage is moved based on the thus obtained shift amounts and rotation shift amount to correct the position (shift and rotation shift) of the substrate 1. Note that instead of the pre-alignment measurement unit, the off-axis alignment scope 40 may be set to be able to perform detection at a low magnification, and then detect the pre-alignment mark.

In step S5, it is determined whether to execute global alignment. As a criterion for determining whether to execute global alignment, for example, a manufacturing process parameter (for example, the first layer or the second layer) or the type of the substrate 1 (for example, a blank mold or the like) can be used. For example, if it is determined not to execute global alignment, the process advances to step S7; otherwise, the process advances to step S6.

Figure 7:
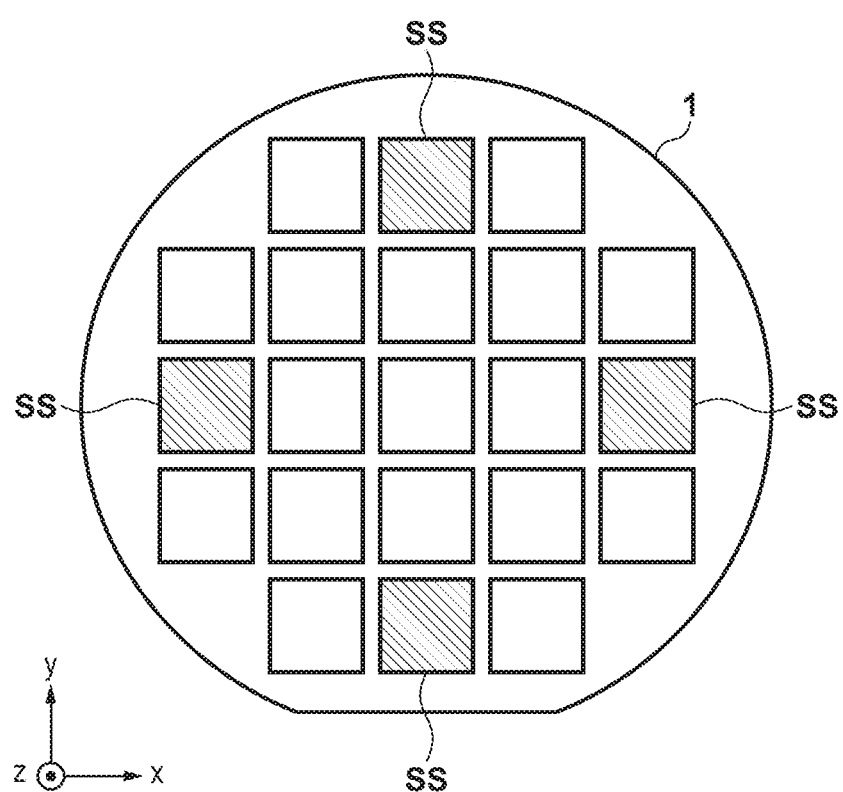
FIG. 7 is a view showing an example of an array of shot regions of a substrate.

In step S6, global alignment is executed. FIG. 7 is a view showing an example of an array of shot regions of the substrate 1. In FIG. 7, a region indicated by a solid line rectangle corresponds to one shot region. In this example, scribe lines are formed between the shot regions but the shot regions may include the scribe lines. In this embodiment, shot regions indicated by hatched rectangles in FIG. 7 are set as sample shot regions SS, and then global alignment is executed. More specifically, the off-axis alignment scope 40 detects an alignment mark provided in each sample shot region SS. Next, based on the detection result of the off-axis alignment scope 40, the position of the alignment mark provided in each sample shot region SS is obtained by setting the reference marks on the reference plate 50 as references (reference positions). Based on the positions of the alignment marks in the sample shot regions SS, the shifts in the x and y directions, the rotation shift amount in the θ direction, and the magnifications in the x and y directions of the shot regions (the array thereof) with respect to design values are obtained by a least square method. Then, the array coordinate values of all the shot regions of the substrate 1 are obtained from the values.

In step S7, the shape of the mold 10 is corrected. For example, the adjustment amount of the shape of the mold 10 by the shape adjustment unit 10M is obtained based on the shape of the mold 10 obtained in step S1 and the magnifications of the shot regions obtained by global alignment (step S6), thereby correcting the shape of the mold 10 by the shape adjustment unit 10M.

Note that if the difference between the adjustment amount of the shape of the mold 10 by the shape adjustment unit 10M in step S1 and the adjustment amount of the shape of the mold 10 by the shape adjustment unit 10M in step S7 is large, an abnormality may occur in the shape adjustment unit 10M. To cope with this, mold alignment may be executed again after step S7, and it may be confirmed that the shape adjustment unit 10M surely operates. However, since this confirmation processing influences the productivity of the imprint apparatus 100, it need not be performed if the difference between the adjustment amounts is small. Furthermore, if the shape adjustment unit 10M does not perform a desired operation, the shape adjustment unit 10M is operated while finely adjusting an offset to be reflected, thereby performing final driving.

In step S8, the offset is reflected. The offset is an offset (offset amount) preset in the shape adjustment unit 10M to absorb the difference between the shape of the pattern of the mold 10 and the shape of the pattern of the imprint material formed on the substrate, and is normally set in a recipe or the like. In this embodiment, as will be described later, if the deformation amount of the mold 10 by the imprint process is obtained in step S12, the offset (offset amount) obtained by taking the deformation amount into consideration is reflected. Note that the deformation amount of the mold 10 by the imprint process corresponds to the difference (shape difference) between the shape of the mold 10 before bringing the mold 10 into contact with the imprint material on the substrate and the shape of the mold 10 after separating the mold 10 from the imprint material.

In step S9, the imprint process is performed. More specifically, the imprint material is supplied from the supply unit 32 to the substrate 1, and the mold 10 is brought into contact with the imprint material on the substrate. Next, in a state in which the mold 10 and the imprint material on the substrate are in contact with each other, the imprint material is irradiated with light from the light source 16, and is then cured. Then, by separating the mold 10 from the cured imprint material on the substrate, the pattern of the mold 10 is transferred to the imprint material on the substrate (that is, the pattern of the imprint material is formed).

In step S10, it is determined whether to execute mold alignment. If mold alignment is executed every time the imprint process is performed, the productivity of the imprint apparatus 100 decreases. Therefore, a flag for switching the presence/absence of execution of mold alignment after performing the imprint process is used, or designation of an interval (mold alignment is executed for every N shots) by the number of times of the imprint process or the number of shots is used. If the mold alignment is executed, the process advances to step S11; otherwise, the process advances to step S13.

In step S11, mold alignment is executed, similar to step S1. The shape of the mold 10 obtained in step S11 is stored in the storage unit 80, similar to step S1.

In step S12, the deformation amount of the mold 10 by the imprint process (step S10) is obtained from the shape of the mold 10 accumulated in the storage unit 80. As described above, the deformation amount of the mold 10 corresponds to the difference between the shape (step S1 or S7) of the mold 10 before bringing the mold 10 into contact with the imprint material on the substrate and the shape of the mold 10 after separating the mold 10 from the imprint material. In other words, the deformation amount of the mold 10 obtained in step S12 is the deformation amount generated in the mold 10 by the imprint process, and an amount that cannot be obtained by mold alignment before performing the imprint process. As described above, the deformation amount of the mold 10 obtained in step S12 is reflected on (added to) the offset in the process for the next substrate 1 (step S8).

Figure 8:
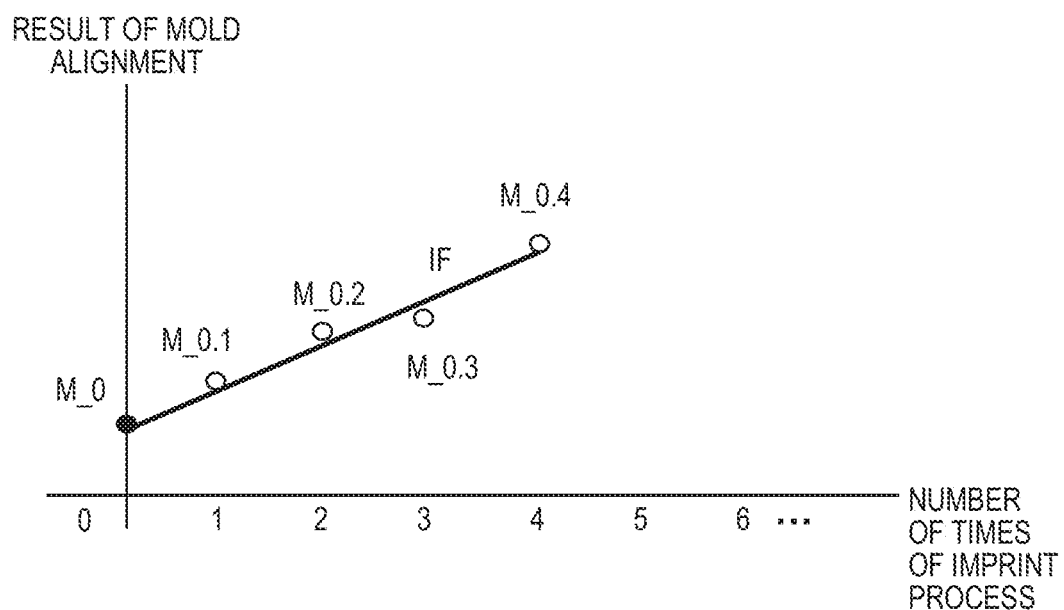
FIG. 8 is a graph showing an example of results of mold alignment.

In this embodiment, as a result of mold alignment, the deformation amount of the mold 10 by the imprint process is accumulated (stored) in the storage unit 80, and managed by the control unit 70. FIG. 8 is a graph showing an example of the results of mold alignment accumulated in the storage unit 80. In FIG. 8, the ordinate represents the result of mold alignment (the deformation amount of the mold 10), and the abscissa represents the number of times of the imprint process (the use count of the mold 10). In FIG. 8, the results of mold alignment are represented by M_0, M_0.1, M_0.2, . . . , and especially M_0 is set as the initial value.

A deformation amount ΔMagX_1 of the mold 10 after performing the imprint process once can be represented by the difference between M_0.1 and M_0. Similarly, a deformation amount ΔMagX_N of the mold 10 after performing the imprint process N times can be represented by:

$$\Delta MagX\_N = M\_N - M\_N-1$$

As shown in FIG. 8, it is possible to obtain, from the results of mold alignment, information IF indicating a tendency concerning the change (deformation amount) of the shape of the mold 10 corresponding to the number of times of the imprint process (the use count of the mold 10). For example, by performing a statistic operation of the results of mold alignment for each of a plurality of molds 10, the information IF indicating the tendency of the deformation amount of the mold 10 corresponding to the number of times of the imprint process is obtained for each mold 10. If the information IF is obtained, it is possible to obtain the deformation amount of the mold 10 corresponding to the number of times of the imprint process from the information IF, and to thus skip mold alignment (step S11) after the imprint process (step S9). Note that since the tendency of the deformation amount of the mold 10 corresponding to the number of times of the imprint process is different depending on the combination of the mold 10 and the imprint apparatus 100, if the number of times of the imprint process increases, the deformation amount of the mold 10 may be saturated.

Figure 9:
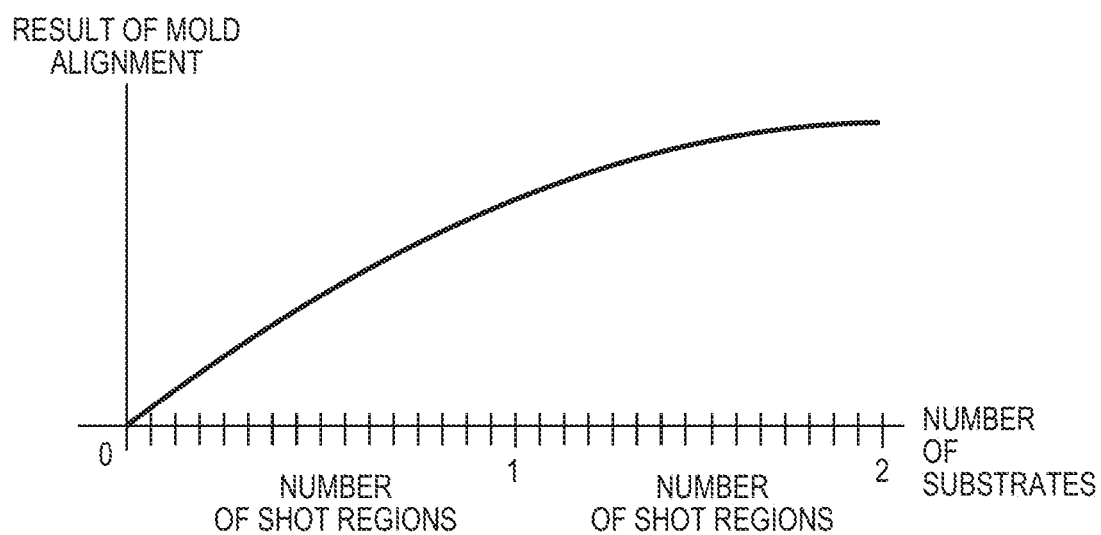
FIG. 9 is a graph showing another example of results of mold alignment.

FIG. 9 is a graph showing another example of the results of mold alignment accumulated in the storage unit 80. In FIG. 9, the ordinate represents the result of mold alignment (the shift amount of the mold 10), and the abscissa represents the number of substrates 1, more specifically, the number of shot regions of the substrate 1 (the use count of the mold 10). FIG. 9 shows a state in which a plurality of shot regions are formed on each of two substrates 1. With reference to FIG. 9, as the number of times of the imprint process for the shot regions of the substrate 1 increases (the number of times of the imprint process increases), the mold 10 has a tendency to shift in one direction. In this way, information indicating the tendency of the shift amount of the mold 10 corresponding to the number of times of the imprint process is obtained.

Note that there may be a large difference between the tendency (average) of the results of mold alignment accumulated for each mold 10 and the result of current mold alignment. In this case, it is determined that an abnormality occurs in conveyance or holding of the mold 10, mold alignment, or the imprint process, and the operation of the imprint apparatus 100 is stopped.

Based on the information indicating the tendency concerning the change (deformation amount) of the shape of each of the plurality of molds 10, it may be determined whether the tendency occurs for the plurality of molds 10 or only for the specific mold 10, and then maintenance may be performed. FIGS. 10A and 10B are tables each showing, for the plurality of molds 10 (A to F or G to L), results of comparison with the past tendency of the deformation amount. With reference to FIG. 10A, the difference from the past tendency of the deformation amount is equal to or smaller than a threshold (0.2 in this embodiment) for molds A to E but exceeds the threshold for mold F. This indicates that the tendency of the deformation amount of mold F is different from the tendencies of the deformation amounts of molds A to E. In this case, since it can be considered that an abnormality occurs in mold F, for example, a cleaning process or the like is performed for mold F.

With reference to FIG. 10B the difference from the past tendency of the deformation amount is equal to or smaller than the threshold (0.2 in this embodiment) for all molds G to L but all the tendencies indicate the same direction. In this case, since it can be considered that the apparatus state changes with time, for example, a cleaning process or the like is performed for the chuck that holds the mold.

Referring back to FIG. 6, in step S13, it is determined whether there is a shot region for which the imprint process has not been performed. If there is a shot region for which the imprint process has not been performed, the process returns to step S8 to perform the imprint process for the next shot region; otherwise, the process advances to step S14.

In step S14, it is determined whether there is the substrate 1 for which the imprint process has not been performed. If there is the substrate 1 for which the imprint process has not been performed, the process returns to step S2 to perform the imprint process for the next substrate 1; otherwise, the operation ends.

According to this embodiment, information indicating the tendency concerning the deformation amount of the mold 10 corresponding to the number of times of the imprint process is obtained (steps S1, S11, and S12). Based on the information, the imprint process is performed while correcting the shape of the mold 10 by the shape adjustment unit 10M in accordance with the number of times of the imprint process (steps S8 and S9). More specifically, from the information indicating the tendency concerning the deformation amount of the mold 10 corresponding to the number of times of the imprint process, the change amount of the shape of the mold 10 corresponding to the number of times of the imprint process is obtained. Then, the imprint process is performed while correcting the shape of the mold 10 by the shape adjustment unit 10M so as to reduce the change amount. As described above, since the imprint apparatus 100 can correct the shape of the mold 10 without detecting the alignment marks on the substrate 1, it is advantageous in correcting the shape of the mold 10 while maintaining the productivity. Therefore, the imprint apparatus 100 is particularly preferable to create a replica mold obtained by transferring the pattern of the master mold to a substrate on which no alignment marks are formed, for example, a blank mold. Similarly, the imprint apparatus 100 is also preferable to create the first layer on the substrate.

This embodiment has exemplified magnification components and shift components as the change of the shape of the mold 10 by the imprint process. However, the present invention is not limited to them. For example, the change of the shape of the mold 10 by the imprint process includes a trapezoid component, a focus component, and a tilt component in addition to the magnification components and shift components.

The pattern of a cured product formed using the imprint apparatus 100 is used permanently for at least some of various kinds of articles or temporarily when manufacturing various kinds of articles. The articles are an electric circuit element, an optical element, a MEMS, a recording element, a sensor, a mold, and the like. Examples of the electric circuit element are volatile and nonvolatile semiconductor memories such as a DRAM, a SRAM, a flash memory, and a MRAM and semiconductor elements such as an LSI, a CCD, an image sensor, and an FPGA. Examples of the mold are molds for imprint.

The pattern of the cured product is directly used as the constituent member of at least some of the above-described articles or used temporarily as a resist mask. After etching or ion implantation is performed in the substrate processing step, the resist mask is removed.

A detailed method of manufacturing an article will be described next. As shown in FIG. 11A, the substrate 1 such as a silicon wafer with a processed material such as an insulator formed on the surface is prepared. Next, an imprint material is applied to the surface of the processed material by an inkjet method or the like. A state in which the imprint material is applied as a plurality of droplets onto the substrate is shown here.

As shown in FIG. 11B, a side of the mold 10 for imprint with an uneven pattern is directed to and caused to face the imprint material on the substrate. As shown in FIG. 11C, the substrate 1 to which the imprint material is applied is brought into contact with the mold 10, and a pressure is applied. The gap between the mold 10 and the processed material is filled with the imprint material. In this state, when the imprint material is irradiated with light serving as curing energy through the mold 10, the imprint material is cured.

As shown in FIG. 11D, after the imprint material is cured, the mold 10 is separated from the substrate 1. Thus, the pattern of the cured product of the imprint material is formed on the substrate. In the pattern of the cured product, the concave portion of the mold 10 corresponds to the convex portion of the cured product, and the convex portion of the mold 10 corresponds to the concave portion of the cured product. That is, the uneven pattern of the mold 10 is transferred to the imprint material.

As shown in FIG. 11E, when etching is performed using the pattern of the cured product as an etching resistant mask, a portion of the surface of the processed material where the cured product does not exist or remains thin is removed to form a groove. As shown in FIG. 11F, when the pattern of the cured product is removed, an article with the grooves formed in the surface of the processed material can be obtained. Here, the pattern of the cured product is removed. However, instead of processing or removing the pattern of the cured product, it may be used as, for example, an interlayer dielectric film included in a semiconductor element or the like, that is, a constituent member of an article.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent application No. 2019-077872 filed on Apr. 16, 2019, which is hereby incorporated by reference herein in its entirety.

What is claimed is:

1. An imprint apparatus that performs an imprint process of forming a pattern of an imprint material on a substrate using a mold and curing the formed pattern using curing energy, comprising:
  a mold shape adjuster configured to adjust a shape of the mold;
  a measurement unit including at least one scope configured to measure the shape of the mold;
  a memory configured to store instructions; and
  a processor communicatively connected to the memory and configured to execute the stored instructions to function as a control unit configured to:
    obtain information indicating a tendency concerning a change of the shape of the mold corresponding to a use count of the mold used for the imprint process, the information generated based on (1) a difference between the shape of the mold measured by the measurement unit before bringing the mold into contact with the imprint material on the substrate in a previous performance of the imprint process and the shape of the mold measured by the measurement unit after separating the mold from the imprint material in the previous performance of the imprint process and (2) the use count of the mold corresponding to the previous performance of the imprint process;
    control the mold shape adjuster to correct the shape of the mold in accordance with the obtained information and a present use count of the mold; and control the imprint apparatus to perform the imprint process after the shape of the mold has been corrected.

2. The imprint apparatus according to claim 1, further comprising a plurality of reference marks provided on a stage that holds the substrate,
wherein the measurement unit is further configured to measure the shape of the mold with reference to the plurality of reference marks.

3. The imprint apparatus according to claim 1, wherein the memory is further configured to accumulate differences in the shape of the mold measured by the measurement unit during previous performances of the imprint process, and
wherein the control unit is further configured to obtain the information based on the differences in the shape of the mold accumulated in the memory.

4. The imprint apparatus according to claim 1, wherein the control unit is further configured to, before controlling the imprint apparatus to perform the imprint process, obtain, from the information, a change amount of the shape of the mold that occurs in the mold when the mold is brought into contact with the imprint material on the substrate and corresponding to the present use count of the mold, and control the mold shape adjuster to correct the shape of the mold so as to reduce the change amount.

5. The imprint apparatus according to claim 4, wherein, based on the change amount and a preset offset amount, the control unit is further configured to determine an adjustment amount for adjusting the shape of the mold by the mold shape adjuster.

6. The imprint apparatus according to claim 1, wherein the mold comprises a master mold, and
the substrate comprises a blank mold to which a pattern of the master mold is transferred.

7. The imprint apparatus according to claim 1, wherein the control unit is further configured to control the mold shape adjuster to correct the shape of the mold before the mold is brought into contact with the imprint material on the substrate in the imprint process.

8. The imprint apparatus according to claim 1, wherein the control unit is further configured to obtain the information for each of a plurality of molds used in the imprint process.

9. The imprint apparatus according to claim 1, wherein the change of the shape of the mold includes at least one of a magnification component, a trapezoid component, a focus component, and a tilt component.

10. A method of manufacturing an article, comprising:
forming a pattern on a substrate using an imprint apparatus that performs an imprint process for forming the pattern of an imprint material on the substrate using a mold and curing the formed pattern using curing energy, the imprint apparatus including:
a mold shape adjuster configured to adjust a shape of the mold;
a measurement unit including at least one scope configured to measure the shape of the mold;
a memory configured to store instructions; and
a processor communicatively connected to the memory and configured to execute the stored instructions to function as a control unit configured to:
obtain information indicating a tendency concerning a change of the shape of the mold corresponding to a use count of the mold used for the imprint process, the information generated based on (1) a difference between the shape of the mold measured by the measurement unit before bringing the mold into contact with the imprint material on the substrate in a previous performance of the imprint process and the shape of the mold measured by the measurement unit after separating the mold from the imprint material in the previous performance of the imprint process and (2) the use count of the mold corresponding to the previous performance of the imprint process;
control the mold shape adjuster to correct the shape of the mold in accordance with the obtained information and a present use count of the mold; and
control the imprint apparatus to perform the imprint process after the shape of the mold has been corrected;
processing the substrate on which the pattern is formed in the forming; and
manufacturing the article from the processed substrate.

* * * * *